United States Patent [19]

Auphan

[11] 4,117,328
[45] Sep. 26, 1978

[54] INFRARED RADIATION SENSITIVE IMAGE PICK-UP DEVICE

[75] Inventor: Michel Joseph Auphan, Paris, France

[73] Assignee: U.S. Philips Corporation, New York, N.Y.

[21] Appl. No.: 793,864

[22] Filed: May 4, 1977

[30] Foreign Application Priority Data

May 26, 1976 [FR] France .................. 76 15986

[51] Int. Cl.² ............................................ H01J 31/49
[52] U.S. Cl. .................................... 250/330; 250/338
[58] Field of Search .............. 250/330, 332, 333, 334, 250/338

[56] References Cited

U.S. PATENT DOCUMENTS

| 3,772,518 | 11/1973 | Murayama et al. | 250/332 X |
| 3,946,264 | 3/1976 | Crowell | 250/332 X |

Primary Examiner—Davis L. Willis
Attorney, Agent, or Firm—Frank R. Trifari; Carl P. Steinhauser

[57] ABSTRACT

An infra-red imaging device consisting of two sheets of interconnected disks of piezoelectric material, at least one of which has a ferroelectric transition temperature. A metal foil is provided between the sheets and mutually parallel, conductive strips are provided on both outer surfaces of the assembly thus formed, the direction of the strips on the one surface differing from that of the strips on the other surface. A generator for periodic signals which can be sequentially connected to each strip on one of the surfaces of the first sheet generates therein, via a piezoelectric effect, ultrasonic vibrations which are intercepted by the other sheet which converts these vibrations into electric signals. These signals are amplified and carry the image to be examined.

6 Claims, 4 Drawing Figures

INFRARED RADIATION SENSITIVE IMAGE PICK-UP DEVICE

The invention relates to an infrared radiation sensitive image pick-up device.

The invention notably relates to a device for reproducing the image of an object on the basis of the infrared radiation emitted by this object, the said device comprising the following components: at least one target of a material having a ferroelectric transition temperature in which a thermal image of an object can be formed, means for the point-wise reading of this thermal image by point-wise conversion of the thermal image into an electric signal, and means for exciting the said material without the piezoelectric properties of the material being lost.

A device of this kind is particularly suitable for passive thermal image formation of scenes without auxiliary infrared illumination.

For infrared image pick-up and for the detection of infrared radiation, use is generally made of devices utilizing an effect which is referred to as "piezeoelectric" effect.

This effect has since long been known and consists in a fast change of the electric polarisation of a pyroelectric substance, the said fast change giving rise to a change of a surface charge which is supported by the substance as a result of the local variation of the temperature.

When an image of an object, emitting infrared radiation, which is to be made visible is projected on a target made of the said piezoelectric material, a thermal image of the object is formed on the said target. The said thermal image generates an electric potential in each point of the target, the said potential being characteristic of the infrared energy intercepted in the relevant point. These electric potentials can subsequently be read by means of a cathode ray beam which scans the said target.

Numerous known vacuum tubes which are generally known as "pyroelectric vidicon tubes" operate in accordance with this principle; the sensitivity of these tubes, however, is usually insufficient. For practical applications it is desirable to have a system enabling detection of temperature differences of less than 1° C. of objects having an emission factor of approximately 1 in an ambient temperature of approximately 27°. This corresponds to a contrast which is approximately equal to the contrast of the thermal image observed. The said devices of the "pyroelectric vidicon tube" type supply electric signals which do not correspond to the image itself, but rather to the time derivatives of the said image, so that mechanical means are required for the operation of these devices for the modulation of the radiation image, so that these tubes are comparatively complex.

It is also known, for example, from the article by A. Glanc, published in 1974 in "Infrared Physics", volume 14, pages 151 and 152, to realise a detection system for infrared radiation, but this system does not utilise the pyroelectric effect but rather another effect which is sometimes associated with the said effect, i.e. piezoelectric effect. In the case of, for example, a ferroelectric body which has a second-order transition temperature, which is the case for triglycine sulphate (abbreviated as TGS), the piezoelectricity occurs in the form of a spontaneous polarisation as soon as a temperature is reached which is lower than the transition temperature (also referred to as the Curie temperature or Curie point).

The piezoelectric effect consists in the occurrence of electric charges on surfaces of a piezoelectric body which is subjected to mechanical or electroacoustic pressure.

Numerous physical substances exhibit the said piezoelectric effect. In accordance with the said article by A. Glanc, given piezoelectric materials, notably those which are strongly dependent on the ambient temperature at approximately the transition temperature (which is the case, for example, for triglycine sulphate), when subjected to ultrasonic vibrations of constant intensity in the presence of infrared radiation, exhibit the phenomenon that an electric signal occurs on the free surface of these materials, the frequency of the said signal being approximately equal to that of the incident ultrasonic field, the characteristics of the said signal being dependent of the local value of the piezoelectric factor, while this factor is dependent on the local temperature.

One of the objects in accordance with the invention is the realisation of an image pickup device in which the use is avoided of a high-vacuum tube and the associated means and for which it is not necessary to take into account other auxiliaries implying a similar restriction is avoided. To this end, in accordance with the invention use is made of a matrix system on two parallel faces for reading information present in each point. As a result of the use of such a switching system, the reading or analysis can be sequentially effected.

It is a further object of the invention to realise a device whose sensitivity is better than that of the known devices and whose operation is reliable. This object is achieved by using at least two targets of piezoelectric material, one target serving to generate ultrasonic vibrations by means of sequentially applied electric signals in each point, while the other target receives these ultrasonic vibrations and generates electric signals in reaction thereto, the said signals being applied to a measuring network for amplification, filtering and detection. Moreover, the supplied electric signals directly correspond to the formed image itself rather than to the time derivatives thereof.

The invention thus provides a device in which first parallel strips of conductive material are provided on a first target of piezoelectric material having a ferroelectric transition temperature, the said strips being each time sequentially connected, by way of a switching system, to a generator of periodic signals, while on the other surface of the said target a foil of conductive material which has a fixed electric potential is provided, a second target of piezoelectric material being connected parallel to the said foil. On the outer surface of the assembly thus formed there is provided a second set of parallel strips of conductive material which have a direction which differs from the first direction and which are connected to at least one network comprising means for the detection of the signals. A device of this kind enables infrared images to be picked up with a favourable sensitivity.

A disk-shaped substrate of insulating material is preferably arranged between one of the targets of piezoelectric material and the foil of conductive material. The realisation and the operation of the device in accordance with the invention are thus facilitated.

In order to obtain the described advantage, it is alternatively possible to connect the device, by means of an adhesive, to a substrate of insulating material which serves as a mechanical support.

Preferably, at least one of the targets of piezoelectric material is made of triglycine sulphate. The sensitivity of the image pick-up device in accordance with the invention is thus improved.

A preferred embodiment of a device in accordance with the invention which has a simpler construction and operation can be achieved by ensuring that the said first parallel strips of conductive material enclose an angle of approximately 90° with the said second parallel strips.

Preferably, grooves are provided in the surface of at least one of the targets of piezoelectric material, between each pair of strips of conductive material. Thus, the parasitic coupling which may occur between the strips of conductive material is substantially reduced.

The invention will be described in detail hereinafter with reference to the drawing.

FIG. 1 shows a polarisation curve and a piezoelectric response curve for a body having a ferroelectric transition temperature, FIG. 2 shows a first embodiment of the device in accordance with the invention, FIG. 3 shows a second embodiment of the device in accordance with the invention, and FIG. 4 shows a block diagram for the processing of the electric signals in a device in accordance with the invention.

FIG. 1 shows a polarisation curve B and a piezoelectric response curve A, as a function of the temperature of ° C, of a body having a transition temperature.

The curves relate to triglycine sulphate which is used by way of example, because this material is frequently used as a material having a piezoelectric characteristic with ferroelectric transition temperature (Curie point).

An additional advantage consists in that the Curie temperature of triglycine sulphate (47° C.) does not excessively deviate from room temperature.

However, there are also other materials having a transition temperature. These materials are usually piezoelectric at a temperature below the transition temperature. Therfore, an adapted material is to be chosen in dependence of the temperature of the scene to be recorded, so that the transition temperature of the material chosen is approximately equal to or higher than the temperature of the scene to be recorded.

FIG. 1 clearly shows that, when use is made of the piezoelectric effect in order to obtain a sensitive device for thermal imaging, it is advantageous to choose a working point on the steep part of the curve A. This is because a comparatively large potential is then produced at a small temperature change already.

One of the ways of obtaining a working point on the said steep part of the curve is to increase the mean temperature of a sheet of a material of the type TGS by the application of an ultrasonic excitation field. This is because the ultrasonic energy is partly absorbed in the material. The material is then heated, which may be attributed to the piezoelectric effect. Below the transition temperature (Curie point) there is no piezoelectric effect in the case of triglycine sulphate. Therefore, excitation which causes pressure modulation is not accompanied by heating either.

As a result, a dependency is realised between the temperature of the disk and a transition temperature which is slightly lower than this temperature, and hence automatic control of the mean temperature of the sheet is also obtained.

FIG. 2 is a perspective view of a first device in accordance with the invention.

Figure 2:
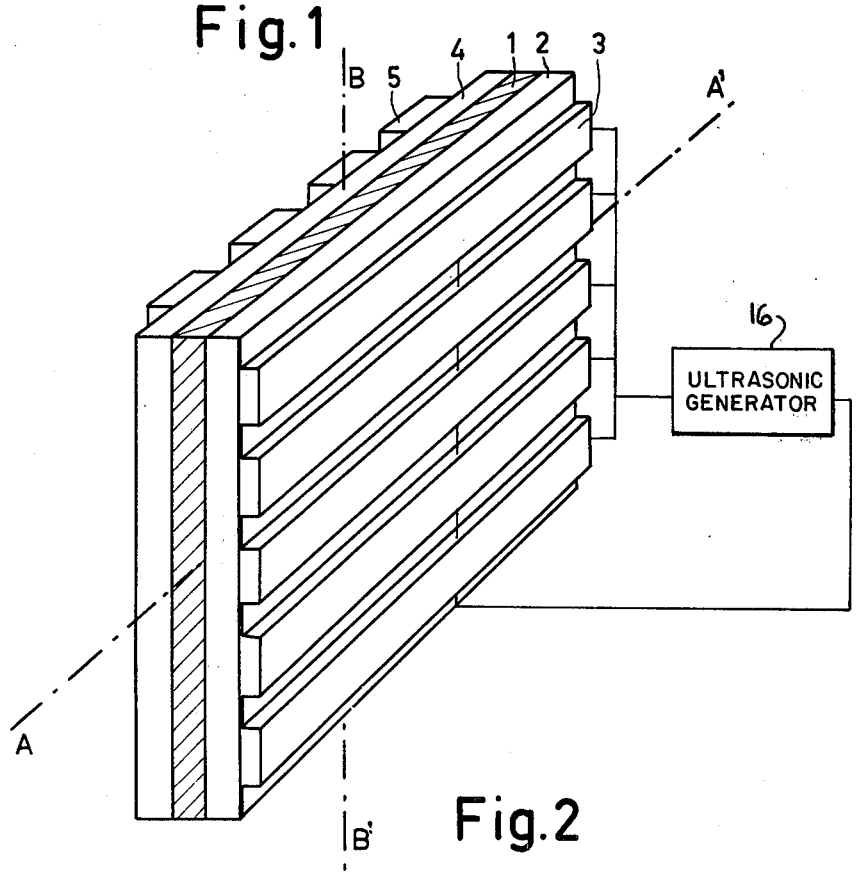
FIGS. 2 and 3 illustrate two embodiments of the device in accordance with the invention.

FIG. 2 shows two sheets 2 and 4 of piezoelectric material which are separated by a metal layer 1 thus forming a sandwich structure having a horizontal axis A—A' and a vertical axis B—B'. On the two outer surfaces of the unit thus formed there is provided a matrix system formed by parallel strips of conductive material, the direction of the parallel strips on the one surface differing from the direction of the parallel strips on the other surface. The said directions are preferably at least approximately perpendicular to each other. This also simplifies the manufacture.

It is not necessary to use the same material for both sheets. One of the sheets, for example, the sheet 2, is made of a piezoelectric material having a ferroelectric transition temperature, while the other sheet, i.e., the sheet 4, is made, for example, of a normal piezoelectric material, for example, quartz, lithium niobate, etc. The operating temperature of the said plates need not necessarily be the same either.

When the surface of the sheet 2 is subjected to the infrared radiation emitted by an object via suitably transmitting optical transmission system, a thermal image of the said object is formed on the said sheet. Each image point of the sheet then assumes a temperature which is dependent of the quantity of infrared radiation incident thereon.

Figure 1:
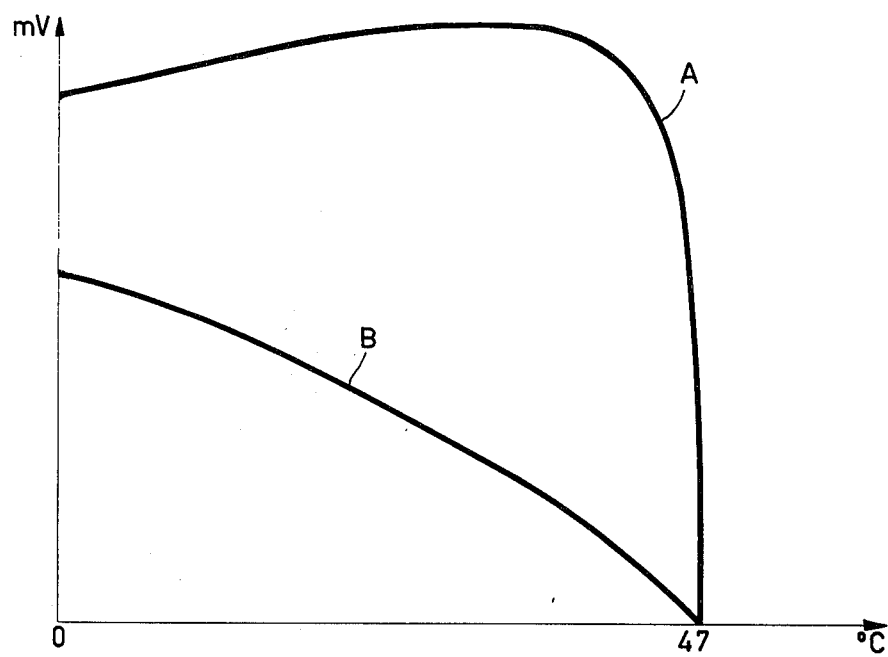

FIG. 1 shows that when the sheet 2 is brought to a mean temperature which does not substantially differ from and is slightly lower than the transition temperature, for example, by the excitation of the said sheet by means of ultrasonic waves produced by an ultrasonic generator 16, this sheet operates at a working point which is situated in a very steep part of the curve A, as already described by A. Glanc in the said article. Thus, in the image points of the sheet comparatively large variations of piezoelectric potentials are already obtained at comparatively small temperature fluctuations in these image points.

Thus, the sensitivity is higher as the operating temperature of the disk is nearer to the transistion temperature. The said piezoelectric potential variations can be recorded, thus forming an electric image of the thermal image of the object to be examined.

Figure 3:
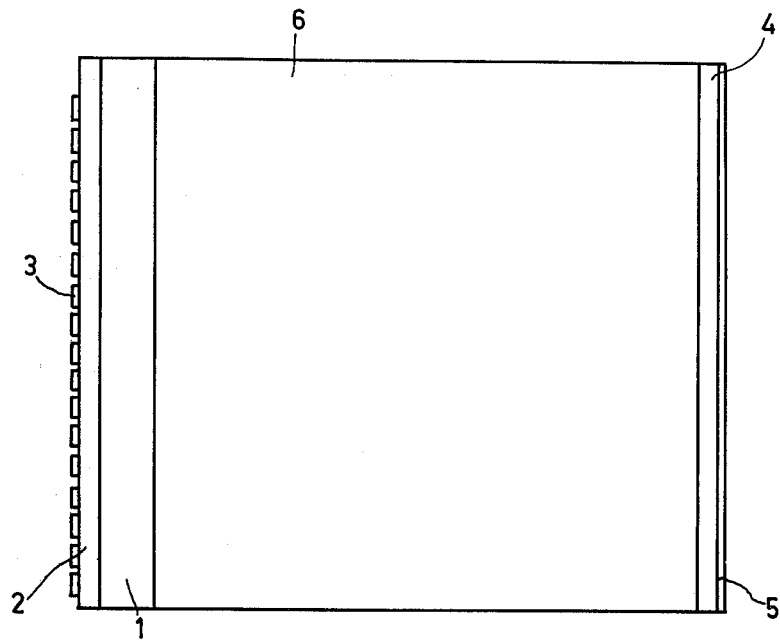

To this end, the device comprises a second sheet 4 of standard piezoelectric material (for example, quartz, lithium niobate, etc.), which is connected by a metal layer 1 to the first sheet 2, as shown in FIG. 2, or via an intermediate insulating substrate 6, as shown in FIG. 3, a thin conductive metal foil separating the two sheets from each other in both cases for reasons which will be described hereinafter.

As a result of the excitation of the first sheet 2 by sequential application of a uniform ultrasonic field to each of the conductor strips 3, an alternating potential occurs on the surface of the sheet 2, the frequency thereof being the same as that of the incident ultrasonic field.

As a result of the use of a second sheet 4, it is thus possible to intercept the ultrasonic field applied to the first sheet 2, this field having a different characteristic in each point as a result of the point-wise and instantaneous variation of the piezoelectric constant of the material of the sheet 2, the said variation itself being the result of the relative temperature of each point in dependence of the incident infrared radiation.

The ultrasonic field present in each point of the sheet 4 causes an electric signal which is dependent on the magnitude of the piezoelectric effect of the material.

The said signal is proportional to the product of the two piezoelectric factors of the sheets 2 and 4, of the temperature of the surface element which is situated opposite the strip 3 which receives the ultrasonic energy at this instant, and of the conductive strip 5 which is to be taken into consideration at the said instant because it gives access to the said electric signal (read operation) and is used for intercepting the said electric signal for further processing. For the second sheet 4, therefore, a normal piezoelectric effect without transition temperature suffices.

The conductive metal foil 1 prevents electromagnetic transmission from the one sheet to the other sheet, because one of the said disks is electrically excited by an ultrasonic field and hence transmits ultrasonic waves, while the other sheet receives these ultrasonic waves.

When the sheets 2 and 4 are both made of the same material, or when they at least have transition temperatures which do not substantially deviate, the intercepted electric signal is proportional to the square of the common piezoelectric factor and the sensitivity of the device is higher than when use is made of substantially different materials.

Both sheets 2 and 4 may be made of either monocrystalline or polycrystalline materials, or may even comprise a plurality of layers of the said materials.

For connecting the two sheets and the intermediate metal foil, known methods can be used. The said components can be connected, for example, by means of glue or by vapour deposition of a metal layer which forms the foil 1 on one of the sheets, after which the other sheet (or the substrate of FIG. 3) can be provided thereon by means of glue. It is alternatively possible to use a conductive type of glue. In that case the metal foil can actually be simply formed by a thin layer of such a glue, provided between the two sheets.

The conductive strips 3 and 5 can also be realised in a conventional manner by photoetching and vapour deposition or sputtering. An improvement in accordance with the invention concerns the parasitic coupling between each pair of conductive strips, which occurs due to transmission of the ultrasonic waves through the piezoelectric material, notably on the side where the ultrasonic waves are transmitted (disk 2). In order to reduce the said coupling, more or less deep grooves can be provided on the surface of the sheet between each pair of conductive strips.

FIG. 3 shows an embodiment in which a substrate 6 is made of an insulating material, for example, aluminum oxide or beryllium oxide. Generally speaking, the substrate is made of a material having a high thermal conductivity and a low thermal capacity.

When use is made of a substrate of this kind, favourable dissipation of heat is possible. Moreover, the said substrate enables a simple construction, because the thickness of the components 1, 2 and 4 is comparatively small (for example, in the order of 0.01 mm for the sheets 2 and 4, and 0.1 mm for the substrate 1); the thickness $e$ of the substrate may than be in the same order of magnitude as the thickness of the surface element which coincides with two conductive strips, while the thickness of a sheet may be small in comparison with the thickness $e$. As a result, excessive diffusion of the ultrasonic waves can be prevented.

Acoustic focussing can then also be very simply realised. Use is then made of an assembly of programmed electronic circuits which will be described hereinafter.

In an embodiment which is not shown, use can be made of a substrate of the described kind which serves as a mechanical support, for example, for a device as shown in FIG. 2. In that case there is no acoustic focussing problem and the technological realisation of the assembly is also simple.

It has already been stated that one of the ways of ensuring automatic temperature control of one of the sheets consists in the realisation of a temperature dependency via the method proposed by A. Glanc.

Another possibility in this respect consists in the provision, on the side which is remote from the incident infrared radiation, of a foil of black material which emits radiation in dependence of the local temperature.

In the case of, for example, the embodiment just described, the said foil can be provided on the substrate on the side which is remote from the incident infrared radiation.

It may be advantageous to accommodate the device in accordance with the invention in a space in which a low atmospheric pressure prevails. A pressure deficiency of, for example, a few millimeters mercury is sufficient to ensure thermal insulation.

It may also be advantageous to provide, for example, by vapour deposition, a layer which absorbs the infrared radiation on the sheet which receives the said radiation, so that the said radiation is not reflected by the conductive strips which are usually metallic.

Figure 4:
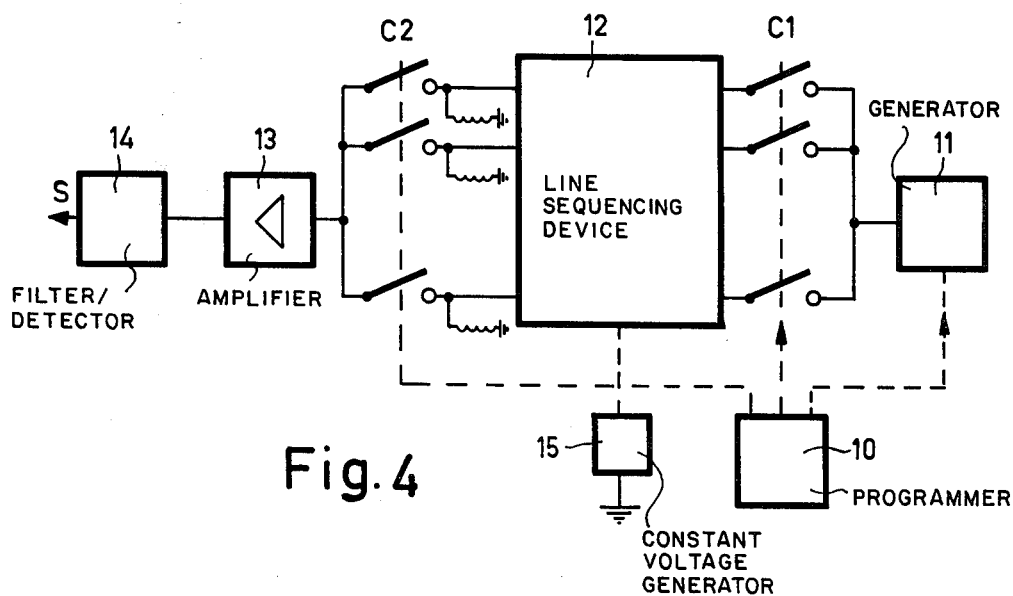

FIG. 4 shows a block diagram of the operation of the device in accordance with the invention. The diagram comprises two switching systems $C_1$ and $C_2$ which are controlled in a space-dependent and time-dependent manner by an electronic programmer 10.

A generator 11 which periodically supplies signals whose frequency (for example, in the order of magnitude of 10 MHz) equals the resonant frequency governed inter alia by the thickness of the assembly which is formed by the interconnected sheets and which is shown in the FIGS. 2 and 3, is sequentially switched by a switching system $C_1$ on one of the said parallel strips which form given kinds of scanning lines. Thanks to this circuit, a device 12 is line-wise actuated, which is made possible by the preferred embodiments described with reference to the FIGS. 2 and 3.

On the other side of the device 12, i.e. on the side of the receiving sheet 4, a further switching system $C_2$ enables each of the columns, i.e. the conductor strips 5, to be connected to a network for processing the collected electric signals, the said network being formed by the elements 13 and 14.

However, there is a risk of an amplitude decrease of the signal due to the parasitic capacitance formed by the piezoelectric material provided between the columns 5 and the separating layer 1.

In order to eliminate this risk, it is possible, due to the fact that the device operates with a high frequency signal whose frequency is known, to compensate for the impedance of the parasitic capacitance of each column by way of a suitable inductance which corresponds to the mechanical resonance of the device at the generator frequency. The said inductances are provided between mass and each column, as is shown in FIG. 4.

By a suitable realisation of the switching operations, the programmer 10 can cover the signals in each point in an arbitrary matrix system. A line can be excited during a given time interval, and during this time interval the signals present on the columns 5 can be successively collected. Each line is thus scanned.

On the other hand, as has already been suggested, the said programmer can perform another function, adapted to an embodiment as shown in FIG. 3.

Thanks to the said programmer and thanks to a set of different switches $C_2$, the acoustic focussing can be realised electronically in known manner by using the embodiment shown in FIG. 3. Thus, a correct phase shift is obtained on the electrodes which correspond to the conductive strips 5, so that a Fresnel transformation is realised on the output electrodes. Because this method is not part of the present invention, it will not be elaborated herein.

The device furthermore comprises an amplifier 13 and a filter/detector 14 for filtering (in order to eliminate the parasitic signals) and detecting the collected electric signals.

It will be obvious that for the processing of the electric signal, instead of using one network for amplifying, filtering and detecting which is switched for each point by the system C2, it is alternatively possible to connect a treatment network for the signal to each conductive strip 2. The signal-to-noise ratio is thus improved, while the time required for scanning an image on the disks is reduced.

It is not necessary for the treatment network for the signals to comprise a filtering element and a detection element in all cases.

By means of a constant voltage generator 15, the metal foil 1 is maintained at a constant potential which may amount, for example, to 0 volts (when a monocrystalline material is used for the manufacture of the disks 2 and 4).

On the output 6 an electric signal is thus obtained which corresponds to the infrared image received.

This signal produces the image itself rather than the time derivative thereof. This is because in the device in accordance with the invention the electric potentials generated via the piezoelectric effect are not erased by the read operation.

However, should a time-derived image be desired, use can be made of an image store, for example, a recording on magnetic tape or an analog or digital memory, the number of elements of which corresponds to the number of image points.

The signal can then be applied to an arbitrary image-forming device, a read system of which is coupled to the programmer 10.

It will be obvious that, as has already been stated, the invention is by no means restricted to the two elaborated embodiments, but that other alternatives are also feasible.

What is claimed is:

1. An infrared imaging device comprising first and second piezoelectric sheets of material each having a ferroelectric transition temperature for storing thermal information, means for point-wise reading said thermal image by point-wise conversion into electric readout signals, and means for exciting said piezoelectric material without loss of the piezoelectric properties thereof including a first strip electrode comprising parallel strips of electrically conductive material on one surface of said first sheet, means connecting said strips sequentially to an electrical pulse generator for introducing piezoelectrically stimulated ultrasonic vibrations in said first sheet, an electrically conductive foil on the other surface of said sheet, means to maintain said foil at a fixed electric potential, the second sheet of piezoelectric material being positioned parallel to the said foil and supporting on the surface remote from the first sheet a second strip electrode having strips in a direction differing from the direction of the strips of the first strip electrode, said strips being connected to a network comprising means for signal detection.

2. A device as claimed in claim 1, wherein a disk-shaped substrate of insulating material is provided between one of the sheets of piezoelectric material and the foil of conductive material.

3. A device as claimed in claim 1, wherein the device is secured to a substrate of insulating material with an adhesive, the said substrate acting as a mechanical support.

4. A device as claimed in claim 1, wherein at least one of the sheets of piezoelectric material consists of triglycine sulphate.

5. A device as claimed in claim 1, wherein the first parallel strips of conductive material enclose an angle of approximately 90° with the second parallel strips of conductive material.

6. A device as claimed in claim 1, wherein grooves are provided in the surface of at least one of the sheets of piezoelectric material between each pair of strips of conductive material.

* * * * *